United States Patent [19]
Drynan

[11] Patent Number: 6,020,642
[45] Date of Patent: Feb. 1, 2000

[54] INTERCONNECTION SYSTEM IN A SEMICONDUCTOR DEVICE

[75] Inventor: John Mark Drynan, Tokyo, Japan

[73] Assignee: NEC Corporation, Tokyo, Japan

[21] Appl. No.: 09/014,898

[22] Filed: Jan. 28, 1998

[30] Foreign Application Priority Data

Jan. 31, 1997 [JP] Japan ................................. 9-017994

[51] Int. Cl.[7] .......................... H01L 23/48; H01L 23/52; H01L 29/40
[52] U.S. Cl. ......................... 257/763; 257/764; 257/770
[58] Field of Search .................................. 257/763, 764, 257/770

[56] References Cited

U.S. PATENT DOCUMENTS

| | | |
|---|---|---|
| 5,008,730 | 4/1991 | Huang et al. . |
| 5,312,773 | 5/1994 | Nagashima . |
| 5,523,624 | 6/1996 | Chen et al. ............................... 257/751 |
| 5,861,671 | 1/1999 | Tsai et al. ................................ 257/750 |
| 5,866,947 | 2/1999 | Wang et al. ............................. 257/764 |

FOREIGN PATENT DOCUMENTS

| | | | |
|---|---|---|---|
| 3256330 | 11/1991 | Japan .......................... | H01L 21/3205 |
| 6349774 | 12/1994 | Japan ............................. | H01L 21/285 |
| 878523 | 3/1996 | Japan ............................. | H01L 21/768 |
| 8306917 | 11/1996 | Japan ............................. | H01L 29/78 |

OTHER PUBLICATIONS

"Tungsten Wiring process technology for submicron era" Fukuda et al The Institute of Electronics, Information and Communication Engineers; Technical Report of IEICE; Nov. 1992; pp. 53–59.

*Primary Examiner*—Ngân V. Ngô
*Attorney, Agent, or Firm*—Hayes, Soloway, Hennessey, Grossman & Hage PC

[57] ABSTRACT

A semiconductor device has a contact plug made of a material other than tungsten, i.e., Ti and TiN films, and an interconnection pattern made of sputtered tungsten and connected to a silicon substrate through the contact plug. The tungsten film has mainly (200) and (211) orientations on the top of the insulator film to reduce the resistivity of the tungsten and has mainly (110) orientation on the exposed regions of the Ti and TiN films at the top of the contact plug.

11 Claims, 1 Drawing Sheet

INTERCONNECTION SYSTEM IN A SEMICONDUCTOR DEVICE

BACKGROUND OF THE INVENTION (a) Field of the Invention

The present invention relates to an interconnection system in a semiconductor device and, more particularly, to the structure of a contact plug in the interconnection system. The present invention also relates to a method for manufacturing such an interconnection system in a semiconductor device.

(b) Description of the Related Art

Finer pattern for an interconnection system, as well as higher-integration and miniaturization for device elements, has been increasingly developed in semiconductor devices such as DRAMs. For the finer pattern and more complicated structure of the interconnection system, multi-level interconnection structure overlying a silicon substrate is generally used in the semiconductor device.

In the multi-level interconnection system, an interconnection layer is connected with an underlying interconnection layer or a diffused region of a device element through a contact plug filled in a through-hole or via-hole, which is formed in an inter-level insulator layer.

For a higher operational speed and a higher integration of device elements in the semiconductor devices, a lower resistivity is especially desired in the material used for the interconnection system including the contact plug.

In a semiconductor memory device, such as a DRAM, silicide on polysilicon (polycide) and tungsten silicide are proposed for use as the materials of the gate electrodes or word lines and bit lines, respectively. In this structure, polycide or doped polysilicon is generally used for the contact plugs connecting an overlying interconnection layer and the source/drain regions of MOSFETs constituting memory cells as well as the contacts of capacitor elements.

With further integration and finer pattern of the memory cells in a memory device, however, even the tungsten silicide, polycide or doped polysilicon is not satisfactory as a low resistive material.

Patent Publication JP-A-3(1991)-256330 proposes that a CVD tungsten film be used instead of the tungsten silicide film etc. In this structure, since the CVD tungsten film has poor adherence to an insulator film, a first underlying film made of titanium (Ti) and a second underlying film made of tungsten (W) are consecutively formed on the insulator film by sputtering before the CVD tungsten film is formed.

The CVD tungsten film formed according the teaching by the patent publication as mentioned above has problems in that the effective diameter of the contact plug is reduced compared to the depth thereof due to the three layer structure of the contact plug, that the three-layer structure raises the resistivity of the interconnection pattern on the insulator film compared to a single tungsten film, and that the fabrication process including a plasma enhanced etching step is complicated.

SUMMARY OF THE INVENTION

It is therefore an object of the present invention to provide an interconnection system including a contact plug having a low resistivity to increase the operational speed of semiconductor devices and capable of simplifying the manufacturing process thereof.

It is another object of the present invention to provide a method for manufacturing such a semiconductor device.

The present invention provides a semiconductor device comprising a silicon substrate, an insulator film overlying the silicon substrate and having a through-hole therein, a contact plug formed in the through-hole, and a tungsten film formed on the insulator film and on a top of the contact plug.

The present invention also provides a method for manufacturing a semiconductor device comprising the steps of forming an insulator film overlying a semiconductor substrate and having a through-hole therein, forming a contact plug made of a material other than tungsten in the through-hole, and forming a tungsten film by sputtering on the insulator film and on a top surface of the contact plug.

The present invention further provides another method for manufacturing a semiconductor device comprising the steps of forming an insulator film overlying a semiconductor substrate, forming a tungsten film on the insulator film by sputtering, forming a through-hole in the insulator film and the tungsten film, and forming in the through-hole a contact plug made of a material other than tungsten.

In accordance with the present invention, the sputtered tungsten film has an excellent adherence to the insulator film compared to the CVD tungsten film and has a lower resistivity compared to the three-layer structure as mentioned above, whereas the contact plug can be formed as a single-layer or two-layer structure so that the process can be simplified.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1:
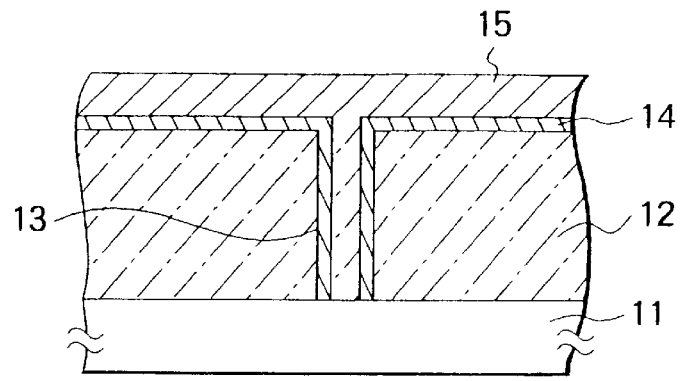
FIGS. 1 to 3 are cross-sectional views of a semiconductor device according to an embodiment of the present invention in consecutive steps for manufacturing the same.

Referring first to FIG. 1, in the manufacture of a semiconductor device according to an embodiment of the present invention, diffused regions of device elements such as MOSFETs (not specifically shown in the figure) in a DRAM are formed in a silicon substrate 11 of p-conductivity or n-conductivity type. A silicon oxide film or interlevel dielectric film 12 having a through-hole 13 is formed on the silicon substrate.

The through-hole 13 exposing a portion of the silicon substrate 11 has a specified aspect ratio which is larger than 2. In this example, the diameter (di) of the through-hole is 0.25 $\mu$m and the depth (dp) of the through-hole is larger than 0.5$\mu$m to obtain the specified aspect ratio (dp/di) more than 2.

On the top surface of the inter-level dielectric film 12 and inside the through-hole 13, a 30 nm-thick Ti film 14 is formed by a CVD technique, on which a 100 nm-thick TiN film 15 is formed also by a CVD technique. As shown in FIG. 1, the through-hole 13 is entirely filled with the Ti film 14 and the TiN film 15 without void, whereas the top surface of the insulator film 12 is entirely covered by the Ti film 14 and the TiN film 15. Titanium silicide (not shown) is formed at the boundary for the ohmic contact between the silicon substrate 11 and the Ti film 14 in the through-hole 13.

Figure 2:
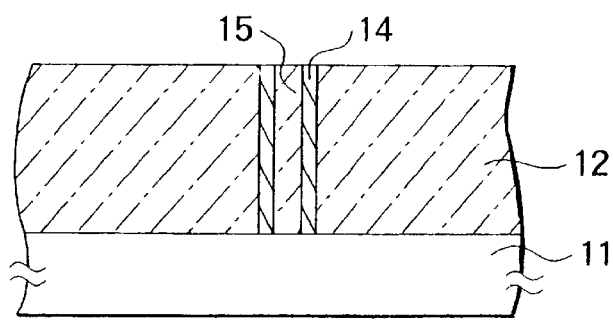

Subsequently, as shown in FIG. 2, the Ti film 14 and the TiN film 15 are removed from the top surface of the insulator film 12 by a chemical-mechanical polishing (CMP), reactive-ion etching (RIE) or etch-back technique. As a result, a contact plug having a two layer structure of Ti/TiN and flush with the top surface of the insulator film 12 is left on the silicon substrate 11 in the through-hole 13.

Figure 3:
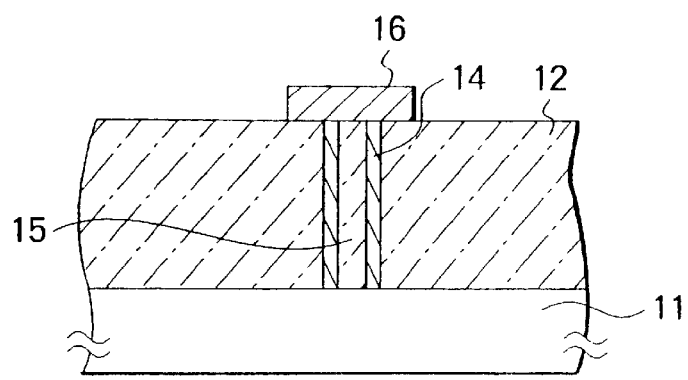

Thereafter, a 200 nm-thick blanket tungsten film is formed on the top surface of the insulator film 12 and on the contact plug by a sputtering (i.e., PVD) technique, followed by selective etching thereof by a dry etching technique to form an interconnection pattern 16, as shown in FIG. 3. In this structure, the tungsten pattern 16 is connected to the semiconductor substrate 11 through the contact plug having a two-layer structure including the Ti films 14 and the TiN film 15. The sputtered tungsten film 16 has an excellent adherence to the insulator film 12 compared to a CVD tungsten film so that the sputtered tungsten pattern 16 is suitably used as the interconnection pattern on the top surface of the inter-level dielectric film 12.

It was confirmed that the sputtered blanket tungsten film has a sheet resistance of about 1 Ω/square on the top surface of the blanket TiN film but has a sheet resistance of about 0.7 Ω/square on the top surface of the insulator film. This 30% decrease in the sheet resistance was attributable to the orientations of the sputtered tungsten film as described below.

The tungsten film directly sputtered onto the top surface of the insulator film had a mixture of (110), (200) and (211) orientations, whereas the tungsten film formed on the TiN film 15 by CVD or PVD technique had mainly (110) orientation. From this fact, it is derived that the resistance of the sputtered tungsten film can be reduced by controlling or reducing the tungsten film content having (110) orientation. In other words, a lower resistivity film can be obtained in the sputtered tungsten by eliminating the TiN film and/or Ti film to take advantage of the resulting tungsten film containing (200) and (211) orientations.

In this respect, another process may be employed comprising the steps of forming a sputtered tungsten film having (200) and (211) orientations on an insulator film formed on a silicon substrate, forming a through-hole in the insulator film and the tungsten film, and forming a contact plug made of a material other than tungsten, e.g., titanium, in the through-hole for connecting the tungsten film and the silicon substrate.

In the above embodiments, another tungsten film may be additionally formed by a CVD technique on the sputtered tungsten film. These embodiments have been described with reference to the formation of contact plugs to a diffused region in a silicon substrate used as an underlying interconnection layer. This underlying interconnection layer, however, is not limited to silicon, and could be another material such as a metal without affecting the advantages of the embodiments.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a semiconductor substrate, an insulator film overlying said semiconductor substrate and having a through-hole therein, a contact plug consisting of a two layer structure formed in said through-hole and extending from a top surface of the insulator film to the semiconductor substrate, and a tungsten film formed on the top surface of said insulator film and on a top of said contact plug.

2. A semiconductor device as defined in claim 1, wherein said contact plug is made of a material other than tungsten.

3. A semiconductor device as defined in claim 1, wherein said contact plug comprises titanium (Ti).

4. A semiconductor device as defined in claim 3, wherein said contact plug is made of a Ti film and a TiN film.

5. A semiconductor device as defined in claim 1, wherein said tungsten film is formed by sputtering.

6. A semiconductor device as defined in claim 1, wherein said tungsten film has (200) and/or (211) orientations.

7. A semiconductor device as defined in claim 1, wherein said tungsten film is made of a first film portion formed by sputtering and a second film portion formed by chemical vapor deposition (CVD) following said forming of said first film portion.

8. A semiconductor device comprising a semiconductor substrate, an insulator film overlying said semiconductor substrate and having a through-hole therein, a contact plug consisting of a two layer structure of a Ti film and a TiN film formed in said through-hole, and a tungsten film formed on said insulator film and on a top of said contact plug.

9. A semiconductor device as defined in claim 1, wherein said tungsten film is formed by sputtering.

10. A semiconductor device as defined in claim 1, wherein said tungsten film has (200) and/or (211) orientations.

11. A semiconductor device as defined in claim 1, wherein said tungsten film is made of a first film portion formed by sputtering and a second film portion formed by chemical vapor deposition (CVD) following said forming of said first film portion.

* * * * *